(12) United States Patent
Kanai et al.

(10) Patent No.: US 7,692,506 B2
(45) Date of Patent: Apr. 6, 2010

(54) OSCILLATION DRIVER DEVICE, PHYSICAL QUANTITY MEASURING DEVICE, AND ELECTRONIC INSTRUMENT

(75) Inventors: Masahiro Kanai, Suwa (JP); Eitaro Otsuka, Funabashi (JP); Naoki Yoshida, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 52 days.

(21) Appl. No.: 12/181,011

(22) Filed: Jul. 28, 2008

(65) Prior Publication Data
US 2009/0033432 A1 Feb. 5, 2009

(30) Foreign Application Priority Data
Aug. 1, 2007 (JP) ............... 2007-200455

(51) Int. Cl.
*G01N 27/00* (2006.01)
*G01P 15/09* (2006.01)
*H03B 5/32* (2006.01)
*H03B 5/36* (2006.01)
*H03L 5/00* (2006.01)

(52) U.S. Cl. ............ 331/173; 331/65; 331/109; 331/116 FE; 331/159; 331/183; 73/514.34

(58) Field of Classification Search .......... 331/65, 331/66, 74–76, 109, 116 R, 116 FE, 116 M, 331/158, 159, 172, 173, 182, 183; 73/488, 73/514.01, 514.16, 514.34; 310/316.01, 310/329
See application file for complete search history.

(56) References Cited

U.S. PATENT DOCUMENTS

2008/0092675 A1 * 4/2008 Komine .................. 74/5.4

FOREIGN PATENT DOCUMENTS

| JP | A-2002-188925 | 7/2002 |
| JP | A-2002-350139 | 12/2002 |
| JP | 2003-240556 | 8/2003 |
| JP | 2004-286503 | 10/2004 |

OTHER PUBLICATIONS

U.S. Appl. No. 11/882,203, filed Jul. 31, 2007, Kanai et al.
U.S. Appl. No. 11/984,977, filed Nov. 26, 2007, Kanai et al.

* cited by examiner

*Primary Examiner*—David Mis
(74) *Attorney, Agent, or Firm*—Oliff & Berridge, PLC

(57) ABSTRACT

An oscillation driver device includes a gain control amplifier, an automatic gain control circuit, and a mode setting circuit. When the mode setting circuit has switched a mode from a normal operation mode to a low power consumption mode, the automatic gain control circuit is disabled, and the gain in an oscillation loop that drives the vibrator changes from a state in which the gain in the oscillation loop is controlled to be unity by the automatic gain control circuit to a state in which the gain in the oscillation loop is set to be larger than unity. When the mode setting circuit has switched the mode from the low power consumption mode to the normal operation mode, the automatic gain control circuit resumes operation, and the gain in the oscillation loop changes from the state in which the gain in the oscillation loop is set to be larger than unity to the state in which the gain in the oscillation loop is controlled to be unity by the automatic gain control circuit.

7 Claims, 12 Drawing Sheets

OSCILLATION DRIVER DEVICE, PHYSICAL QUANTITY MEASURING DEVICE, AND ELECTRONIC INSTRUMENT

Japanese Patent Application No. 2007-200455 filed on Aug. 1, 2007 is hereby incorporated by reference in its entirety.

BACKGROUND OF THE INVENTION

The present invention relates to an oscillation driver device which causes a vibrator to produce driving vibrations, a physical quantity measuring device (e.g. vibrating gyroscope) using the driver device, and an electronic instrument.

Gyroscopes are classified as a rotating gyroscope, a vibrating gyroscope, and the like depending on the method of detecting the force applied to an object. In particular, the vibrating gyroscope is considered to be advantageous for reducing size and cost from the viewpoint of the constituent elements and the like.

As a vibrating gyrosensor which detects the angular velocity applied to an object, a piezoelectric vibrating gyrosensor is known which excites a crystal or a piezoelectric element advantageous for increasing reliability and reducing size. The piezoelectric vibrating gyrosensor utilizes a phenomenon in which a Coriolis force occurs perpendicularly to vibrations when an angular velocity is applied to a vibrating object.

For example, the vibrating gyrosensor which detects an angular velocity causes a physical quantity transducer (vibrator) to produce driving vibrations. When an angular velocity is applied to the vibrator, a Coriolis force occurs perpendicularly to driving vibrations to produce detection vibrations. Since the detection vibrations occur perpendicularly to the driving vibrations, the detection signal (signal component due to the detection vibrations) differs in phase from the driving signal (signal component due to the driving vibrations) by 90 degrees. The detection signal can be synchronously detected separately from the driving signal utilizing the above phenomenon, for example.

The vibrating gyrosensor is used in a wide variety of applications, such as shake detection for a video camera or a digital camera, positioning using a global positioning system (GPS) for a car navigation system, and position detection for an aircraft or a robot.

The vibrating gyrosensor used in these applications is driven by a battery. Therefore, it is necessary to increase the life of the battery by reducing the power consumption of the vibrating gyrosensor as much as possible.

Specifically, it is important to cause the vibrating gyrosensor to promptly transition to the operation state in which the gyrosensor can detect the physical quantity (steady oscillation state). For example, when using a vibrator such as a crystal vibrator which has a high Q value and requires a long time until stable oscillations are achieved after supplying power, it is considerably difficult to achieve a high-speed transition to the steady oscillation state.

In order to reduce power consumption, it is preferable to suspend the operation of an unnecessary circuit when the physical quantity such as the angular velocity need not be detected. When providing a low power consumption mode (sleep mode), the circuit must be designed to enable a high-speed recovery from the low power consumption mode (sleep mode) to the normal operation mode.

JP-A-2004-286503 and JP-A-2003-240556 disclose technologies for reducing the startup time of the vibrating gyrosensor, for example.

JP-A-2004-286503 discloses technology in which a CR oscillation circuit or a ring vibrator is provided in an oscillation loop so that the oscillation amplitude is increased by an amplifier immediately after activation.

JP-A-2003-240556 discloses technology in which a resistor is provided in series with a crystal vibrator to reduce the period of time until the signal from the vibrator is stabilized.

An oscillation driver device for the vibrating gyrosensor must cause the vibrator to constantly vibrate (oscillate) at a resonance frequency in order to stably detect the angular velocity applied to the vibrator. The driver device also must cause the vibrator to oscillate within a short time to start a normal operation. Furthermore, it is preferable to form the driver device using a small circuit with low power consumption in order to increase the life of the battery at low cost.

On the other hand, if the vibrator is formed of a crystal having a high Q value and sealed in a package under vacuum, the Q value of the vibrator increases to a large extent during drive. Therefore, the period of time (startup time) until the signal from the vibrator is stabilized increases when causing the vibrator to produce driving vibrations.

A low power consumption mode (sleep mode) may be provided as the operation mode of the oscillation driver device aiming at reducing its power consumption so that the operation of the circuit is suspended when unnecessary and the normal operation is recovered quickly when necessary. In particular, when causing a crystal vibrator to oscillate, the oscillation startup time increases due to a high Q value. Therefore, it is necessary to at least cause the crystal vibrator to continuously oscillate in order to reduce the normal operation recovery time.

However, according to the technology disclosed in JP-A-2004-286503, when causing the crystal vibrator to oscillate at a frequency close to the driving frequency of the crystal vibrator, the areas of the capacitor and the resistor of the CR oscillation circuit must be increased. This results in an increase in the size and cost of the vibrating gyroscope (vibrating gyrosensor).

According to the technology disclosed in JP-A-2004-286503, it is difficult to cause a crystal vibrator with a high Q value to operate at its driving frequency because the crystal vibrator is driven at another frequency during startup. Therefore, the period of time until stable oscillations are achieved increases when affected by a manufacturing variation and the like. Therefore, the technology disclosed in JP-A-2004-286503 results in an increase in startup time and power consumption, even if a sleep mode is provided.

The technology disclosed in JP-A-2003-240556 requires that a resistor inserted. In general, when incorporating a resistor in an integrated circuit device, it is difficult to apply the desired energy to the vibrator due to a large manufacturing variation of the resistor. According to the technology disclosed in JP-A-2003-240556, the gain is reduced because the energy applied to the vibrator is divided by the resistor.

Therefore, the technology disclosed in JP-A-2003-240556 results in an increase in startup time and power consumption due to the reduced gain, even if a sleep mode is provided.

SUMMARY

According to one aspect of the invention, there is provided an oscillation driver device that is connected to a vibrator to form an oscillation loop and causes the vibrator to produce driving vibrations, the oscillation driver device comprising:

a gain control amplifier that causes the vibrator to produce the driving vibrations by controlling an oscillation amplitude in the oscillation loop;

an automatic gain control circuit that controls the gain of the gain control amplifier based on a signal obtained from the oscillation loop; and a mode setting circuit that switches a mode between a normal operation mode and a low power consumption mode, when the mode setting circuit has switched the mode from the normal operation mode to the low power consumption mode, the automatic gain control circuit being disabled, and a gain in the oscillation loop that drives the vibrator changing from a state in which the gain in the oscillation loop is controlled to be unity by the automatic gain control circuit to a state in which the gain in the oscillation loop is set to be larger than unity; and when the mode setting circuit has switched the mode from the low power consumption mode to the normal operation mode, the automatic gain control circuit resuming operation, and the gain in the oscillation loop changing from the state in which the gain in the oscillation loop is set to be larger than unity to the state in which the gain in the oscillation loop is controlled to be unity by the automatic gain control circuit.

According to another aspect of the invention, there is provided a physical quantity measuring device that measures a physical quantity corresponding to a detection signal output from a vibrator based on driving vibrations produced by the vibrator and the physical quantity to be measured, the physical quantity measuring device comprising:

the vibrator;

the above oscillation driver device that causes the vibrator to produce the driving vibrations; and a detection device that detects an output signal corresponding to the physical quantity based on the detection signal, the detection device including a synchronous detector that synchronously detects the detection signal based on the output from the comparator.

According to a further aspect of the invention, there is provided an electronic instrument comprising the above physical quantity measuring device.

DETAILED DESCRIPTION OF THE EMBODIMENT

Figure 1:
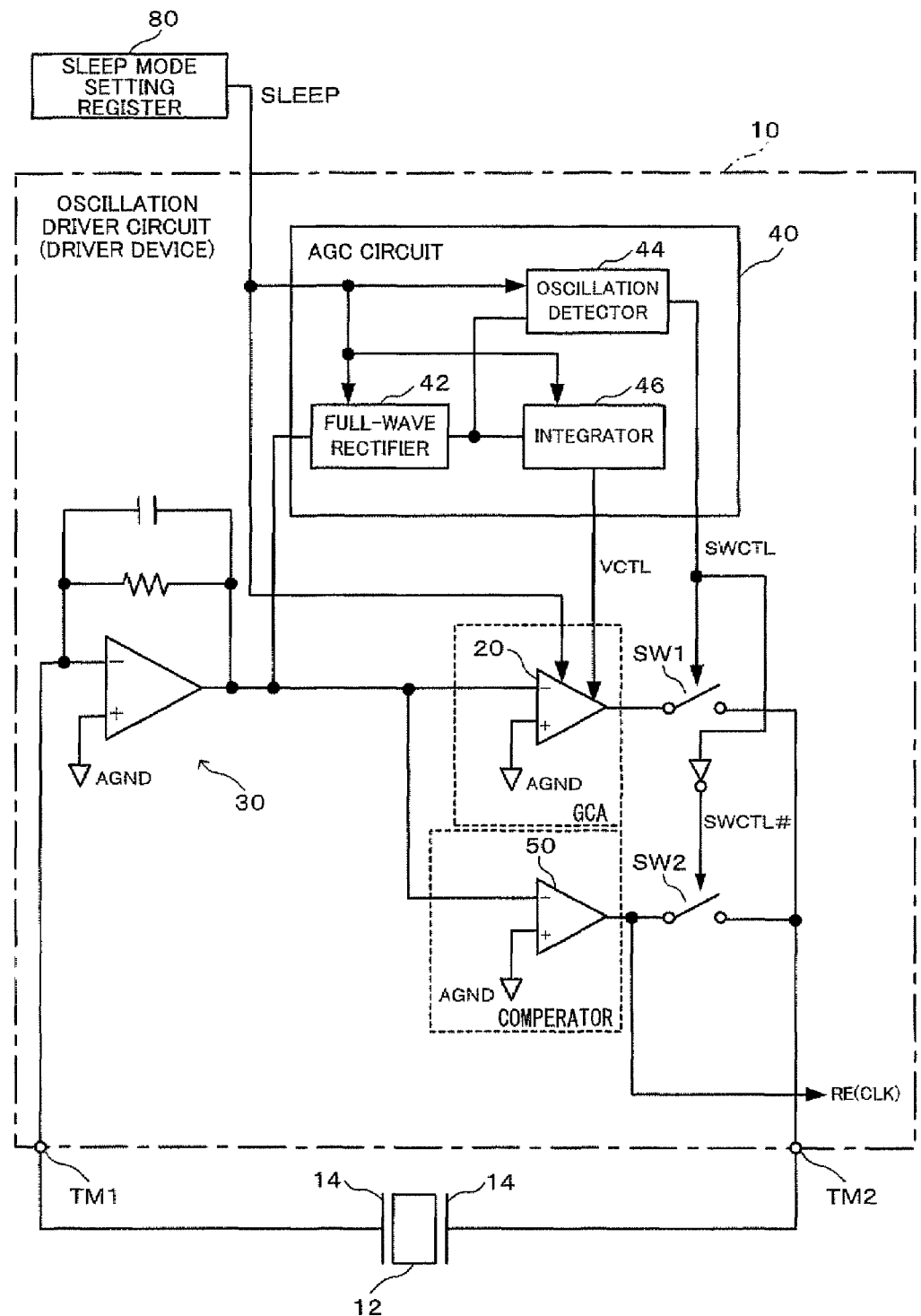
FIG. 1 is a circuit block diagram showing a configuration example of an oscillation driver circuit according to a first embodiment.

At least one aspect of the invention may provide an oscillation driver device which achieves a high-speed recovery from a low power consumption mode to a normal operation mode without increasing the circuit scale, a physical quantity measuring device and an electronic instrument using the driver device.

Aspects of the invention are as follows, for example.

(1) According to one embodiment of the invention, there is provided an oscillation driver device that is connected to a vibrator to form an oscillation loop and causes the vibrator to produce driving vibrations, the oscillation driver device comprising:

a gain control amplifier that causes the vibrator to produce the driving vibrations by controlling an oscillation amplitude in the oscillation loop;

an automatic gain control circuit that controls the gain of the gain control amplifier based on a signal obtained from the oscillation loop; and a mode setting circuit that switches a mode between a normal operation mode and a low power consumption mode, when the mode setting circuit has switched the mode from the normal operation mode to the low power consumption mode, the automatic gain control circuit being disabled, and a gain in the oscillation loop that drives the vibrator changing from a state in which the gain in the oscillation loop is controlled to be unity by the automatic gain control circuit to a state in which the gain in the oscillation loop is set to be larger than unity; and when the mode setting circuit has switched the mode from the low power consumption mode to the normal operation mode, the automatic gain control circuit resuming operation, and the gain in the oscillation loop changing from the state in which the gain in the oscillation loop is set to be larger than unity to the state in which the gain in the oscillation loop is controlled to be unity by the automatic gain control circuit.

When the operation mode of the oscillation driver device has been switched from the normal operation mode to the low power consumption mode, the gain control circuit is disabled. This enables a reduction in power consumption. In the normal operation mode (steady oscillation state), the gain in the oscillation loop is controlled to be unity by the gain control circuit. When the operation mode has been switched to the low power consumption mode, the gain in the oscillation loop changes to and maintained in a state in which the gain in the oscillation loop is larger than unity.

A state in which the gain in the oscillation loop is larger than unity is maintained in the low power consumption mode without stopping driving the vibrator so that a steady oscillation state (i.e., a state in which the gain in the oscillation loop is controlled to be unity so that stable oscillations continue) can be promptly implemented when the operation mode is returned to the normal operation mode.

Specifically, when the vibrator is stopped, it is necessary to implement the steady oscillation state through oscillation startup (i.e., a process in which the voltage amplitude of the oscillation signal is gradually increased) when again driving the vibrator. Since a certain period of time is required until oscillation startup is completed, a considerable period of time is required until the steady oscillation state is implemented. In this case, a quick transition from the low power consumption mode to the normal operation mode cannot be achieved.

According to this embodiment, the gain in the oscillation loop is maintained to be larger than unity in the low power consumption mode without stopping driving the vibrator. In this state, the amplitude of the voltage signal in the oscillation loop is sufficiently large. Therefore, when the operation mode has been switched from the low power consumption mode to the normal operation mode, the gain control circuit that has resumed operation causes the gain in the oscillation loop to be promptly set to be unity. Specifically, when a transition from the low power consumption mode to the normal operation mode has occurred, the oscillation loop is immediately set in the steady oscillation state so that the physical quantity (e.g., acceleration) can be measured.

The gain in the oscillation loop may be maintained to be larger than unity in the low power consumption mode by switching the oscillation loop corresponding to the operation mode, or switching the voltage supplied to the gain control amplifier corresponding to the operation mode, for example. Note that the method is not limited thereto.

(2) In the oscillation driver device, the oscillation driver may include a comparator that generates a synchronous detection reference signal based on a signal obtained from the oscillation loop, the synchronous detection reference signal being used to synchronously detect a detection signal obtained from the vibrator, the oscillation loop that drives the vibrator may include a first oscillation loop that includes the vibrator and the gain control amplifier and a second oscillation loop that includes the vibrator and the comparator;

the gain in the second oscillation loop may be larger than unity;

when the mode setting circuit has switched the mode from the normal operation mode to the low power consumption mode, the automatic gain control circuit may be disabled, and the oscillation loop that drives the vibrator may be switched from the first oscillation loop that includes the vibrator and the gain control amplifier to the second oscillation loop that includes the vibrator and the comparator; and when the mode setting circuit has switched the mode from the low power consumption mode to the normal operation mode, the automatic gain control circuit may resume operation, and the oscillation loop that drives the vibrator may be switched from the second oscillation loop that includes the vibrator and the comparator to the first oscillation loop that includes the vibrator and the gain control amplifier.

In this embodiment, the gain in the oscillation loop is maintained to be larger than unity in the low power consumption mode by switching the oscillation loop. For example, the second oscillation loop can be easily formed by effectively utilizing the comparator that generates the synchronous detection reference signal based on the signal obtained from the oscillation loop.

For example, the vibrator is driven using the first oscillation loop that includes the vibrator and the gain control amplifier in the normal operation mode, and is driven using the second oscillation loop that includes the comparator and the vibrator in the low power consumption mode. The oscillation loop may be switched by complementarily controlling formation/non-formation of the first oscillation loop and the second oscillation loop, for example.

The output voltage of the comparator generally swings to a maximum between power supply voltages (including a voltage which may be considered to be the power supply voltage). The comparator serves as a synchronous detection reference clock signal generation circuit. The gain in the oscillation loop can be efficiently set to be larger than unity without providing an additional circuit by utilizing the output from the comparator for driving the vibrator.

(3) The oscillation driver device may include:

a first switch that is turned ON in the normal operation mode and is turned OFF in the low power consumption mode, the first switch supplying a first gain control signal output from the automatic gain control circuit to the gain control amplifier when the first switch is turned ON; and a second switch that is turned OFF in the normal operation mode and is turned ON in the low power consumption mode, the second switch supplying a second gain control signal that causes the gain in the oscillation loop to be larger than unity to the gain control amplifier when the first switch is turned ON.

In this embodiment, only the oscillation loop including the gain control amplifier is used as the oscillation loop that drives the vibrator. On the other hand, the gain control signal supplied to the gain control amplifier is changed corresponding to the operation mode of the oscillation driver device.

In the normal operation mode, the first gain control signal output from the gain control circuit is supplied to the gain control amplifier through the first switch. In the low power consumption mode, the second gain control signal is supplied to the gain control amplifier through the second switch The first switch and the second switch are ON/OFF-controlled based an output signal from an oscillation detector provided in the gain control circuit.

In the normal operation mode, the voltage level of the output signal from the gain control amplifier is adjusted based on the first gain control signal so that the gain in the oscillation loop is always maintained to be unity.

In the low power consumption mode, the voltage level of the output signal from the gain control amplifier exceeds the maximum amplitude in the normal operation mode based on the second gain control signal so that the gain in the oscillation loop is maintained to be larger than unity.

Note that the gain in the oscillation loop may be maintained to be unity or a value close to unity. The expression "maintaining the gain in the oscillation loop to be larger than unity" includes maintaining the gain in the oscillation loop to be unity or a value close to unity.

(4) In the oscillation driver device, the first gain control signal and the second gain control signal may be voltage signals, and the voltage signals may be supplied to the gain control amplifier as a high-potential-side power supply voltage of the gain control amplifier.

In the embodiment (3), the first and second gain control signals are supplied to the gain control amplifier through the first and second switches as the high-potential-side power supply voltage of the gain control amplifier.

The output voltage level of the gain control amplifier changes when the voltage level of the high-potential-side power supply voltage has changed. For example, the high-potential-side power supply voltage supplied to an output-stage circuit of the gain control amplifier is changed so that the voltage amplitude of the output signal from the output-stage circuit changes.

For example, when the first gain control signal from the automatic gain control circuit is supplied to the gain control amplifier through the first switch as the high-potential-side power supply voltage, if the voltage level of the high-potential-side power supply voltage is set at VCT, the voltage level of the output signal from the gain control amplifier swings between the voltage VCT and a voltage GND, for example. The voltage level of the voltage VCT is adjusted by controlling the automatic gain control circuit so that the gain in the oscillation loop is always maintained to be unity.

When the second gain control signal is supplied to the gain control amplifier through the second switch as the high-potential-side power supply voltage in order to set the gain in the oscillation loop to be larger than unity, the voltage level of the high-potential-side power supply voltage is set at Vx (e.g., Vx>VCT). The voltage amplitude of the output signal from the gain control amplifier swings between the voltage Vx and the voltage GND, for example. Therefore, since the voltage amplitude of the drive signal from the vibrator increases sufficiently, the gain in the oscillation loop becomes larger than unity.

The gain in the oscillation loop can be easily maintained to be larger than unity in the low power consumption mode using a simple method that changes the high-potential-side power supply voltage supplied to the gain control amplifier by complementarily switching the first switch and the second switch.

(5) In the oscillation driver device, the vibrator may be a capacitive-coupling vibrator; and the gain control amplifier may cause the vibrator to produce the driving vibrations by applying a rectangular-wave driving signal to the vibrator.

The rectangular-wave drive method has an advantage in that the variation in the driving signal is small. Moreover, since the voltage amplitude can be easily controlled, the circuit configuration can be simplified, whereby the circuit scale can be reduced.

When using the capacitive-coupling vibrator (i.e., a vibrator in which a direct-current blocking capacitor lies in the signal path in the internal equivalent circuit), an arbitrary potential may be used as the direct-current potential of the oscillation loop, whereby the degrees of freedom relating to the circuit configuration are increased. A piezoelectric element can be given as an example of the capacitive-coupling vibrator (capacitive vibrator).

(6) According to another embodiment of the invention, there is provided a physical quantity measuring device that measures a physical quantity corresponding to a detection signal output from a vibrator based on driving vibrations produced by the vibrator and the physical quantity to be measured, the physical quantity measuring device comprising:

the vibrator;

one of the above oscillation driver devices that causes the vibrator to produce the driving vibrations; and a detection device that detects an output signal corresponding to the physical quantity based on the detection signal, the detection device including a synchronous detector that synchronously detects the detection signal based on the output from the comparator.

According to this embodiment, a quick transition from the low power consumption mode (sleep mode) to the normal operation mode can be achieved without increasing the circuit scale. Therefore, a small physical quantity measuring device with low power consumption is implemented.

(7) According to another embodiment of the invention, there is provided an electronic instrument comprising the above physical quantity measuring device.

The above physical quantity measuring device has a reduced size and consumes only a small amount of power. Therefore, the electronic instrument including the above physical quantity measuring device also has a reduced size and consumes only a small amount of power.

The embodiments of the invention are described below in detail with reference to the drawings.

Note that the embodiments described below do not in any way limit the scope of the invention laid out in the claims. Note that all elements of the embodiments described below should not necessarily be taken as essential requirements for the invention.

First Embodiment

FIG. 1 is a block diagram showing a configuration example of an oscillation driver circuit (oscillation driver device) according to this embodiment. The oscillation driver circuit (oscillation driver device) according to this embodiment is used to measure a physical quantity using an output signal obtained by synchronously detecting a detection signal output from a vibrator based on driving vibrations produced by the vibrator and the physical quantity to be measured.

Employment of Sleep Mode

An oscillation driver device according to this embodiment has a first operation mode (normal operation mode) and a second operation mode (low power consumption mode: sleep mode). A first oscillation loop including a vibrator and a comparator which generates a synchronization clock signal is used in the second operation mode.

A high-speed transition to the steady oscillation state in the normal operation mode can be achieved when the low power consumption mode is canceled by maintaining the gain in the oscillation loop at a value larger than unity in the low power consumption mode (sleep mode).

The output voltage of the comparator generally swings to a maximum between power supply voltages (including a voltage which may be considered to be the power supply voltage). The comparator serves as a synchronous detection reference clock signal generation circuit. The gain in the oscillation loop can be efficiently set to be larger than unity without providing an additional circuit in the same manner as in the first embodiment by utilizing the output from the comparator for driving the vibrator.

The first embodiment is described below in detail with reference to FIGS. 1 to 5.

Configuration and Operation of Oscillation Driver Device

FIG. 1 is a block diagram showing a configuration example of an oscillation driver circuit (oscillation driver device) according to this embodiment. The oscillation driver circuit (oscillation driver device) according to this embodiment is used to measure a physical quantity using an output signal obtained by synchronously detecting a detection signal output from a vibrator based on driving vibrations produced by the vibrator and the physical quantity to be measured.

An oscillation driver circuit (oscillation driver device) 10 includes first and second connection terminals TM1 and TM2 (electrodes or pads). A vibrator 12 is inserted between the first and second connection terminals outside the oscillation driver circuit 10. An excitation means 14 is attached to the vibrator 12. The excitation means 14 is connected with the oscillation driver circuit 10 to form an oscillation loop. An oscillation starts in a state in which the gain of a driver in the oscillation driver circuit 10 is large (i.e., the gain is larger than unity). In this state, only noise is input to the driver. The noise includes wave motions at a wide range of frequencies including the natural resonance frequency of the desired driving vibrations. The noise is input to the vibrator 12.

The vibrator 12 is formed of a piezoelectric single crystal as described later, for example. A signal containing a large amount of wave motions at the desired natural resonance frequency is output by the frequency filtering effect of the vibrator 12, and input to the driver. The above operation is repeated in the oscillation loop so that the percentage of the signal at the desired natural resonance frequency increases, whereby the amplitude of the signal input to the driver increases.

In the steady oscillation state, the output current from the vibrator 12 is converted into a voltage value using a current-voltage converter 30, and the oscillation amplitude in the oscillation loop is controlled using an auto gain control (AGC) circuit (gain control circuit in a broad sense) 40 based on the voltage value. This causes the gain (loop gain) while the signal goes round the oscillation loop to become unity, and the vibrator 12 stably oscillates in this state.

Stable oscillations of the vibrator are indispensable for the measurement of the physical quantity. Specifically, if the amplitude of the driving signal produced by the vibrator is not constant, the output signal from the vibrator does not become constant, whereby the physical quantity cannot be accurately measured.

It is also indispensable to accelerate the oscillation startup of the vibrator in order to reduce the power consumption of the system including the vibrator and the oscillation driver circuit. Specifically, oscillations can be produced only when required by promptly obtaining stable oscillations, whereby an operation period in which power is unnecessarily consumed can be reduced.

In this embodiment, the oscillation driver circuit 10 uses the comparator 50 as the driver during oscillation startup, and uses the gain control amplifier (hereinafter abbreviated as GCA) 20 as the driver in the steady oscillation state.

In this embodiment, the GCA 20 and the comparator 50 are provided in parallel in the oscillation driver circuit 10. The oscillation driver circuit 10 includes a first switching element SW1 inserted between the output of the GCA 20 and the second connection terminal TM2. The first switching element SW1 is ON/OFF-controlled using a switch control signal SWCTL. The oscillation driver circuit 10 includes a second switching element SW2 inserted between the output of the comparator 50 and the second connection terminal TM2. The second switching element SW2 is ON/OFF-controlled using a switch control signal SWCTL#. The switch control signal SWCTL# is an inversion signal of the switch control signal SWCTL.

The oscillation driver circuit 10 can output the output from the comparator 50 as a synchronous detection clock signal (synchronous detection reference signal).

The oscillation driver circuit 10 has a normal mode (first operation mode in a broad sense) and a sleep mode (second operation mode in a broad sense) as operation modes in order to reduce power consumption. A sleep mode setting register 80 is provided inside or outside the oscillation driver circuit 10. A control circuit (not shown) which controls the oscillation driver circuit 10 sets control data in the sleep mode setting register 80. The oscillation driver circuit 10 operates in the operation mode corresponding to the control data set in the sleep mode setting register 80. For example, when "0" is set in the sleep mode setting register 80, the oscillation driver circuit 10 operates in the normal mode. For example, when "1" is set in the sleep mode setting register 80, the oscillation driver circuit 10 operates in the sleep mode.

A sleep control signal SLEEP corresponding to the control data set in the sleep mode setting register 80 is supplied to the GCA 20 and the AGC circuit 40. When the oscillation driver circuit 10 operates in the sleep mode, the operations of the GCA 20 and the AGC circuit 40 are suspended. In this embodiment, the current-voltage converter 30 and the comparator 50 operate without being disabled (enabled state is maintained) when the oscillation driver circuit 10 operates in the sleep mode.

The AGC circuit 40 includes a full-wave rectifier 42, an oscillation detector 44, and an integrator 46. The full-wave rectifier 42 converts the voltage value converted by the current-voltage converter 30 into a voltage value as a direct-current signal. The oscillation detector 44 detects whether or not the oscillation loop including the vibrator 12 is in an oscillation state based on the voltage value converted by the full-wave rectifier 42, and generates a switch control signal SWCTL corresponding to the detection result. For example, the oscillation detector 44 compares the voltage value converted by the full-wave rectifier 42 with a given reference voltage value, and generates the switch control signal SWCTL based on the comparison result. The integrator 46 generates a control signal VCTL for the GCA 20 to control oscillations in the oscillation loop based on the integration result of the voltage value converted by the full-wave rectifier 42. For example, the integrator 46 integrates the voltage value converted by the fill-wave rectifier 42 to determine the level of the direct-current component, compares the determined level with a given reference signal level, and generates the control signal VCTL based on the comparison result. For example, the high-potential-side power supply voltage of the circuit (output circuit) in the output stage (final stage) of the GCA 20 is controlled based on the control signal VCTL.

Specifically, the sleep control signal SLEEP is supplied to the full-wave rectifier 42, the oscillation detector 44, and the integrator 46. The operations of the full-wave rectifier 42, the oscillation detector 44, and the integrator 46 are suspended when the sleep mode is designated by the sleep control signal SLEEP. The full-wave rectifier 42, the oscillation detector 44, and the integrator 46 operate when the normal mode is designated by the sleep control signal SLEEP.

In this embodiment, the oscillation loop including the vibrator 12 and the GCA 20 and the oscillation loop including the vibrator 12 and the comparator 50 are switched by controlling the first and second switching elements SW1 and SW2 when the normal mode is set in the sleep mode setting register 80. In this embodiment, oscillations continue in the oscillation loop including the vibrator 12 and the comparator 50 when the sleep mode is set in the sleep mode setting register 80.

The AGC circuit 40 performs switch control of the first and second switching elements SW1 and SW2 and oscillation amplitude control of the GCA 20.

Figure 2A:
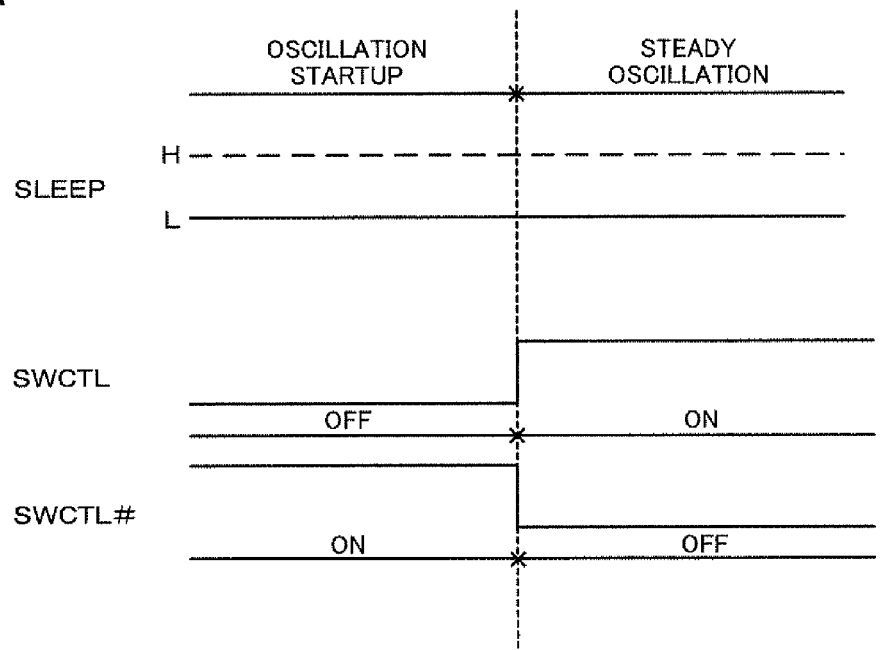
FIGS. 2A and 2B are timing waveform diagrams showing an example of a sleep control signal and switch control signals shown in FIG. 1.
Figure 2B:
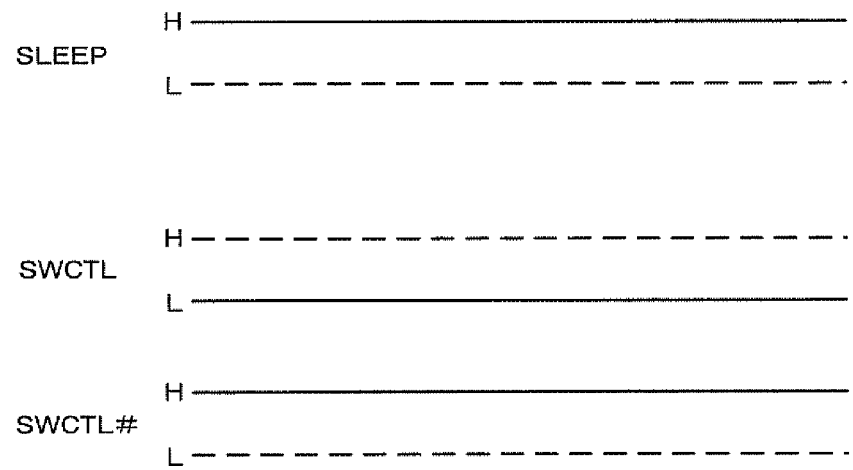

FIGS. 2A and 2B are timing waveform diagrams of the sleep control signal SLEEP and the switch control signals SWCTL and SWCTL#.

FIG. 2A is a timing waveform diagram in the normal mode, and FIG. 2B is a timing waveform diagram in the sleep mode.

In FIG. 2A, the oscillation driver circuit 10 operates in the normal mode when the sleep control signal SLEEP is set at the L level. In the oscillation startup state such as immediately after supplying power, the oscillation detector 44 of the AGC circuit 40 detects that the voltage value obtained by converting the current signal from the vibrator 12 is lower than the given reference voltage value, and the oscillation detector 44 generates the switch control signal SWCTL set at the L level. This causes the first switching element SW1 to be turned OFF and causes the second switching element SW2 to be turned ON. In this case, when the level of the input signal of the comparator 50 has exceeded a given threshold value, the comparator 50 amplifies the input signal by a very large gain to set the gain in the oscillation loop to be larger than unity. As a result, the vibrator 12 is caused to produce driving vibrations during the oscillation startup state so that the gain in the oscillation loop including the vibrator 12 and the comparator 50 is larger than unity and the phase in the oscillation loop is 360×n (n is an integer).

When the oscillation detector 44 has detected that the voltage value obtained by converting the current signal from the vibrator 12 is higher than the given reference voltage value, the oscillation detector 44 generates the switch control signal SWCTL set at the H level. This causes the first switching element SW1 to be turned ON and causes the second switching element SW2 to be turned OFF. In this case, the oscillation amplitude in the oscillation loop is controlled by the GCA 20 based on the control signal VCTL from the AGC circuit 40 so that the gain in the oscillation loop becomes unity. As a result, the oscillation startup state is terminated and transitions to the steady oscillation state. In the steady oscillation state, the vibrator 12 is caused to produce driving vibrations so that the gain in the oscillation loop including the vibrator 12 and the GCA 20 is unity and the phase in the oscillation loop is 360×n.

In this embodiment, the oscillation loop can be switched from the oscillation loop formed by the vibrator 12 and the comparator 50 to the oscillation loop formed by the vibrator 12 and the GCA 20 based on the detection result of the oscillation detector 44, as described above. Specifically, the above switch control is performed on condition that the oscillation detector 44 has detected that the direct-current voltage obtained by converting the current flowing toward the vibrator 12 has reached the given threshold voltage. This enables the switching element to be switch-controlled utilizing the signal detection result from the vibrator 12 generally used for oscillation control of the oscillation loop, whereby a high-speed oscillation startup can be realized without increasing the circuit scale to a large extent.

In FIG. 2B, the oscillation driver circuit 10 operates in the sleep mode when the sleep control signal SLEEP is set at the H level. In this case, the oscillation detector 44 generates the switch control signal SWCTL set at the L level irrespective of whether the oscillation driver circuit 10 is in the oscillation startup state such as immediately after supplying power or the steady oscillation state. This causes the first switching element SW1 to be turned OFF and causes the second switching element SW2 to be turned ON. Specifically, the oscillation driver circuit 10 is set in the same state as the oscillation startup state in the normal mode shown in FIG. 2A. In this case, when the level of the input signal of the comparator 50 has exceeded a given threshold value, the comparator 50 amplifies the input signal by a very large gain to set the gain in the oscillation loop to be larger than unity, as described above. As a result, the vibrator 12 is caused to produce driving vibrations during the oscillation startup state so that the gain in the oscillation loop including the vibrator 12 and the comparator 50 is larger than unity and the phase in the oscillation loop is 360×n (n is an integer). This makes it possible to suspend the operation of the AGC circuit 40 in the sleep mode to reduce power consumption. In the sleep mode, the oscillation state continues in the oscillation loop used during the oscillation startup state in the normal mode. Therefore, a high-speed oscillation startup can be achieved when the operation mode transitions from the sleep mode to the normal mode. Therefore, An oscillation driver device can be provided which can reduce the oscillation startup time without increasing the circuit scale when the oscillation driver device can operate in the sleep mode.

As described above, when the oscillation driver circuit 10 is set in the normal mode, the oscillation driver circuit 10 sets the gain in the oscillation loop formed by the vibrator 12 and the comparator 50 to be larger than unity using the output from the comparator 50, and causes the vibrator 12 to produce driving vibrations by controlling the oscillation amplitude in the oscillation loop formed by the vibrator 12 and the GCA 20. When the oscillation driver circuit 10 is set in the sleep mode, the oscillation driver circuit 10 causes the vibrator 12 to produce driving vibrations in the oscillation loop formed by the vibrator 12 and the comparator 50.

When the oscillation driver circuit 10 includes the AGC circuit 40 which controls the gain of the GCA 20 based on the oscillation signal in the oscillation loop, the oscillation driver circuit 10 can disable the operation of the AGC circuit 40 without disabling the operations of the GCA 20 and the comparator 50 (i.e., while enabling the operations of the GCA 20) when the oscillation driver circuit 10 is set in the sleep mode.

Figure 8:
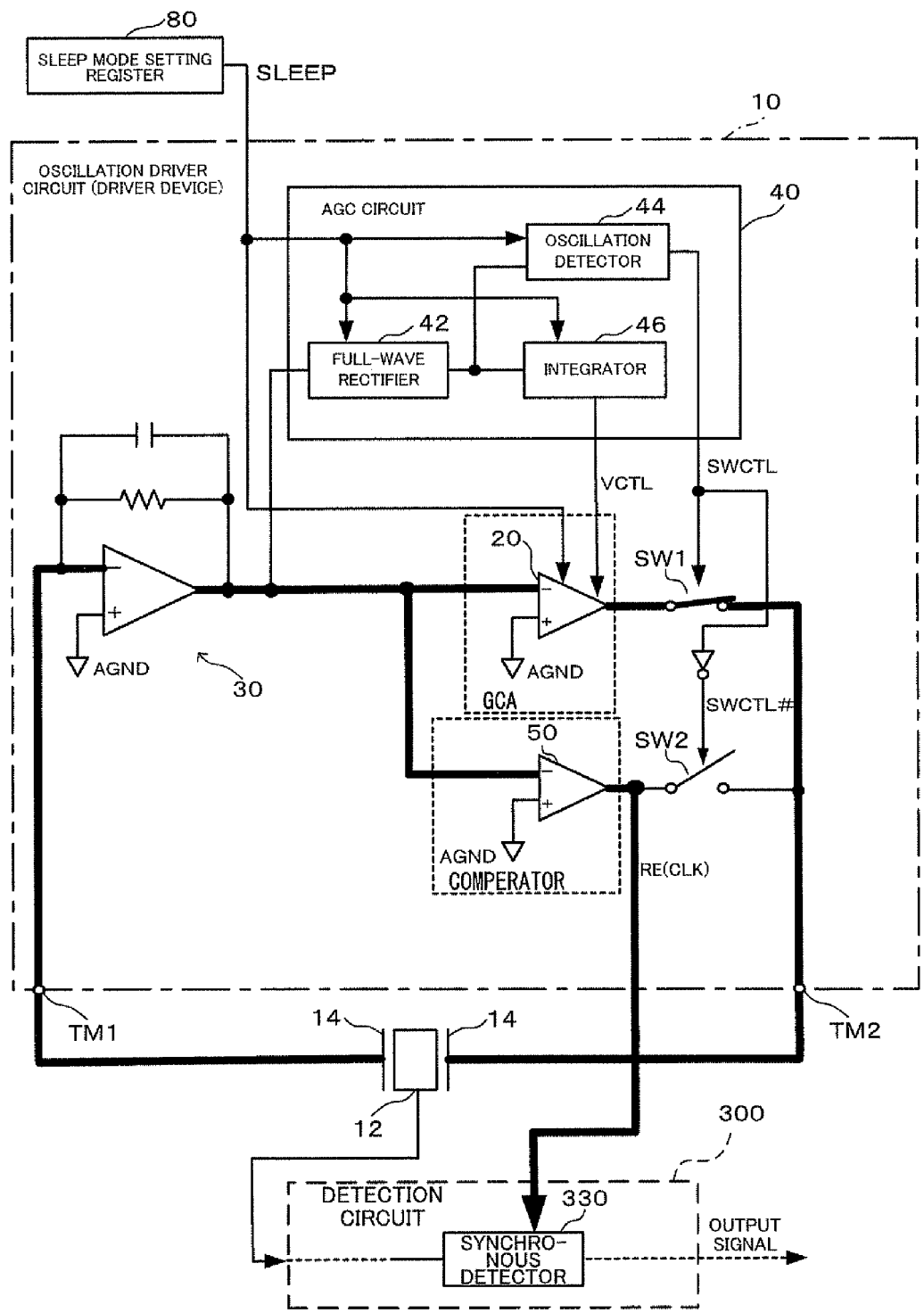
FIG. 8 is a view illustrative of the operation of the oscillation driver device shown in FIG. 1 in a normal operation mode.

FIG. 8 a view illustrative of the operation of the oscillation driver device shown in FIG. 1 in the normal operation mode. In FIG. 8, the operation of the oscillation driver device is indicated by a bold dotted line.

Figure 9:
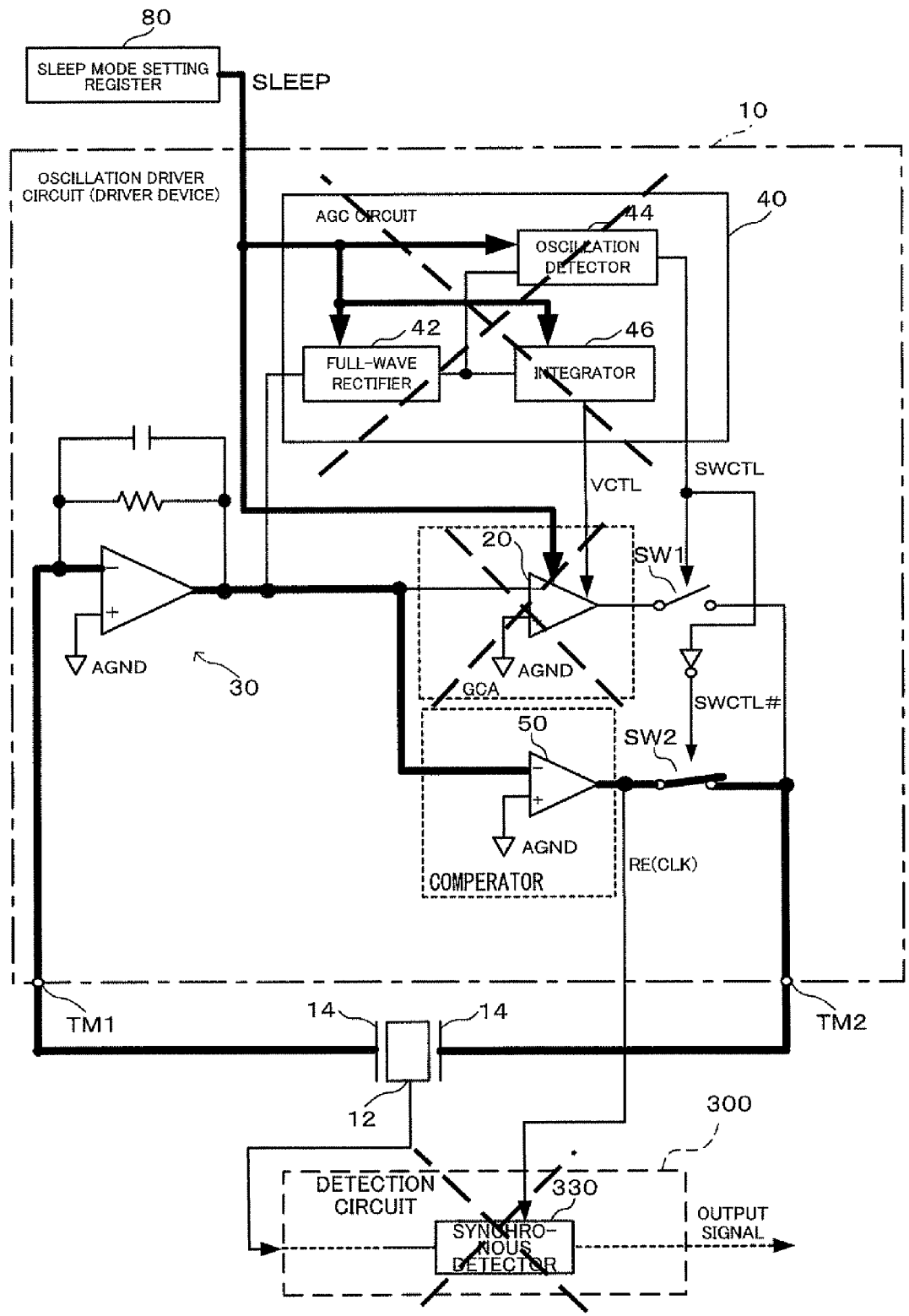
FIG. 9 is a view illustrative of the operation of the oscillation driver device shown in FIG. 2 in a low power consumption mode.

FIG. 9 a view illustrative of the operation of the oscillation driver device shown in FIG. 2 in the low power consumption mode. In FIG. 9, the operation of the oscillation driver device is indicated by a bold dotted line. In FIG. 9, the circuit set in a disabled state is indicated by a dotted cross.

In this embodiment, the output from the comparator 50 is output as the synchronous detection clock signal in the steady oscillation state in the normal mode, for example. Therefore, when measuring the physical quantity using the output signal obtained by synchronously detecting the detection signal output from the vibrator 12 based on driving vibrations produced by the vibrator 12 and the physical quantity to be measured, the synchronous detection process and oscillation startup can be accelerated without increasing the circuit scale.

It is preferable to make the gain of the comparator 50 as large as possible. This makes it possible to increase the loop gain in the oscillation loop formed during the oscillation startup state, whereby the oscillation startup time can be reduced. Moreover, the accuracy of the synchronous detection clock signal output during the steady oscillation state can be increased.

It is preferable that the polarity (inversion and noninversion) of the operational amplifier forming the GCA 20 be the same as the polarity of the operational amplifier forming the comparator 50. This makes it unnecessary to provide a circuit which reverses polarity, even if the oscillation loop is switched using the first and second switching elements SW1 and SW2, whereby an increase in the circuit scale can be suppressed.

Figure 3:
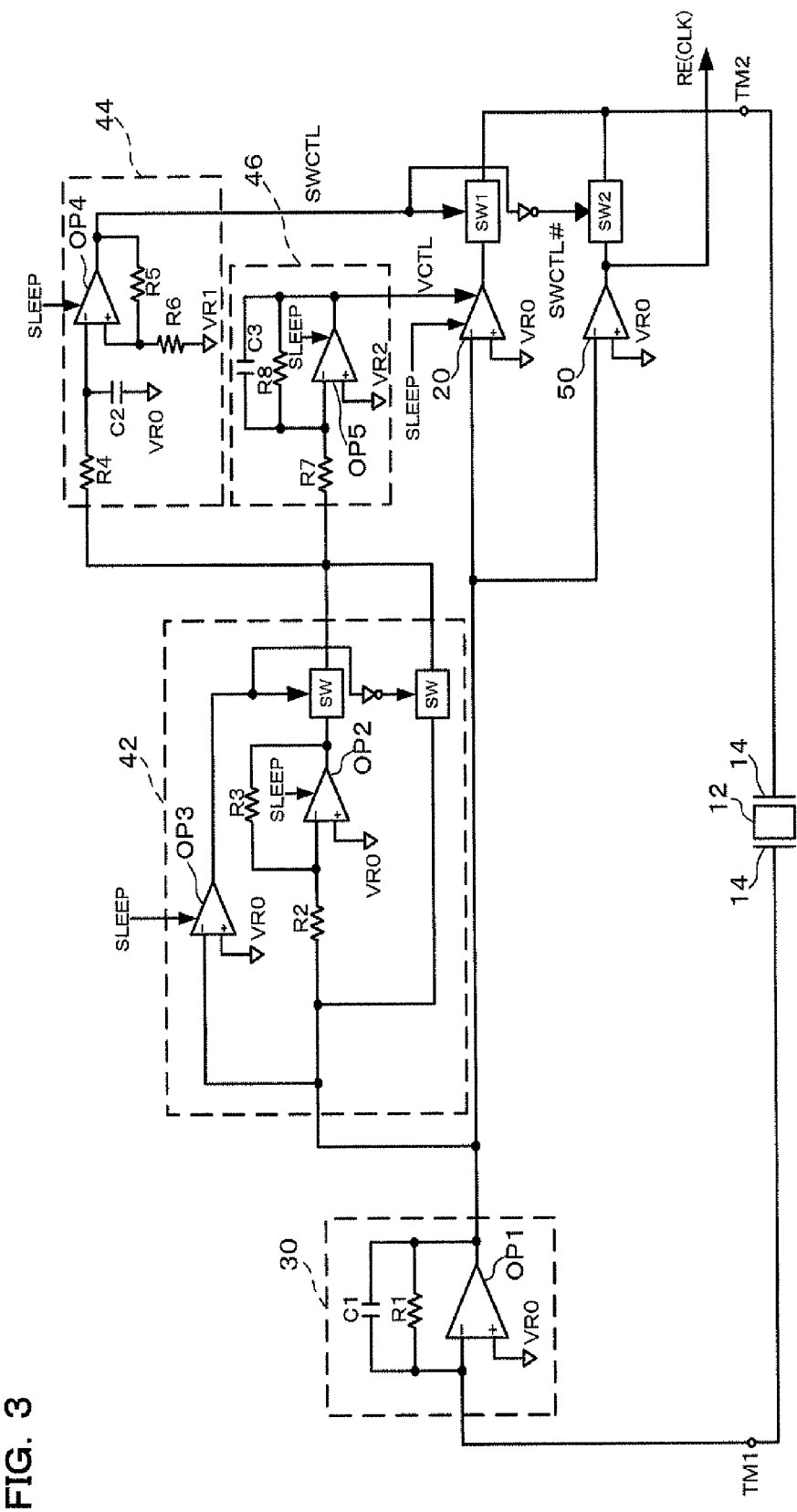
FIG. 3 is a view showing a circuit example of the oscillation driver circuit shown in FIG. 1.

FIG. 3 is a circuit diagram showing a configuration example of the oscillation driver circuit 10 shown in FIG. 1. In FIG. 3, the same sections as in FIG. 1 are indicated by the same symbols. Description of these sections is appropriately omitted.

The current-voltage converter 30 includes an operational amplifier OP1, a feedback capacitor C1, and a feedback resistor R1. A given reference voltage VR0 is supplied to the non-inverting input terminal (+) of the operational amplifier OP1, and the first connection terminal TM1 is electrically connected with the inverting input terminal (−).

The full-wave rectifier 42 includes operational amplifiers OP2 and OP3 and resistors R2 and R3. The operational amplifier OP2 and the resistors R2 and R3 function as an inverting circuit. The operational amplifier OP3 functions as a comparator which compares the output voltage of the current-voltage converter 30 with the reference voltage VR0. The full-wave rectifier 42 includes a switching element provided on the output side of the operational amplifier OP2, and a switching element which bypasses the input and the output of the full-wave rectifier 42. These switching elements are exclusively ON/OFF-controlled based on the output signal from the operational amplifier OP3. When the sleep control signal SLEEP is set at the H level, the operations of the operational amplifiers OP2 and OP3 are stopped by terminating or limiting the operating currents of the operational amplifiers OP2 and OP3. When the sleep control signal SLEEP is set at the L level, the operational amplifiers OP2 and OP3 are caused to operate by generating the operating currents of the operational amplifiers OP2 and OP3.

The oscillation detector 44 includes a low pass filter (hereinafter abbreviated as "LPF") and an operational amplifier OP4. The LPF includes a resistor R4 and a capacitor C2. The resistor R4 is inserted in series between the input and the output of the LPF. One end of the capacitor C2 is electrically connected with the output node of the LPF. A reference voltage VR1 is supplied to the other end of the capacitor C2. The cut-off frequency of the LPF is $1/(2\pi \times C2 \times R4)$. The output node of the LPF is connected with the inverting input terminal of the operational amplifier OP4. A resistor R5 is inserted as a feedback resistor between the output and the non-inverting input terminal of the operational amplifier OP4. The reference voltage VR1 is supplied to the non-inverting input terminal of the operational amplifier OP4 through a resistor R6. The output signal from the operational amplifier OP4 is output as the switch control signal SWCTL. When the sleep control signal SLEEP is set at the H level, the operation of the operational amplifier OP4 is stopped by terminating or limiting the operating current of the operational amplifier OP4. When the sleep control signal SLEEP is set at the L level, the operational amplifier OP4 is caused to operate by generating the operating current of the operational amplifier OP4.

The integrator 46 includes an operational amplifier OP5, resistors R7 and R8, and a capacitor C3. The capacitor C3 is connected as a feedback capacitor of the operational amplifier OP5. The resistor R8 is inserted as a feedback resistor of the operational amplifier OP5. The resistor R7 is inserted between the inverting input terminal of the operational amplifier OP5 and the output node of the full-wave rectifier 42. In the integrator 46, the gain is controlled while reducing the effects of the input voltage offset and the input current offset using the resistors R7 and R8. A reference voltage V R2 is supplied to the non-inverting input terminal of the operational amplifier OP5. The integrator 46 functions as an LPF by the capacitor C3 and the resistor R8. The cut-off frequency is $1/(2\pi \times C3 \times R8)$. The output signal from the operational amplifier OPS is supplied to the GCA 20 as the control signal VCTL. When the sleep control signal SLEEP is set at the H level, the operation of the operational amplifier OP5 is stopped by terminating or limiting the operating current of the operational amplifier OP5. When the sleep control signal SLEEP is set at the L level, the operational amplifier OPS is caused to operate by generating the operating current of the operational amplifier OP5.

The current which flows toward the vibrator 12 in the oscillation startup state is indicated by Id, and the current which flows toward the vibrator 12 in the steady oscillation state is indicated by Id'. The reference voltage VR2 is expressed by the following equation taking into account the smoothing by the current-voltage converter 30, $$VR2=(Id \times R1 \times 2/\pi)+VR0 \qquad (1)$$

where, R1 indicates the resistance value of the feedback resistor of the current-voltage converter 30. Likewise, the reference voltage VR1 is expressed by the following equation.

$$VR1=(Id' \times R1 \times 2/\pi)+VR0 \qquad (2)$$

Since Id'<Id, the reference voltage VR2 is higher than the reference voltage VR1. It is preferable that the reference voltages VR1 and VR2 have the following relationship with the reference voltage VR0.

$$VR0<VR1<VR2 \qquad (3)$$

When the sleep control signal SLEEP is set at the H level, the operation of the GCA 20 is stopped by terminating or limiting the operating current of the GCA 20. When the sleep control signal SLEEP is set at the L level, the GCA 20 is caused to operate by generating the operating current of the GCA 20.

Figure 4A:
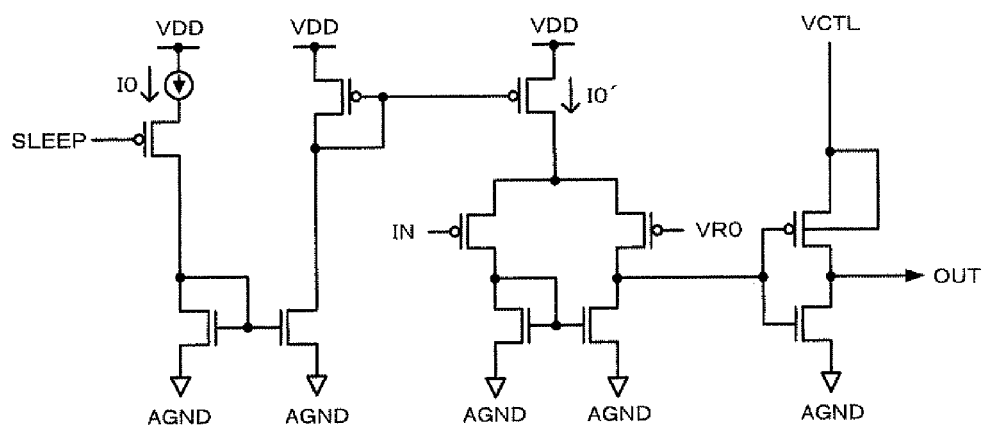
FIGS. 4A and 4B are circuit diagrams showing a configuration example of a gain control amplifier (GCA).
Figure 4B:
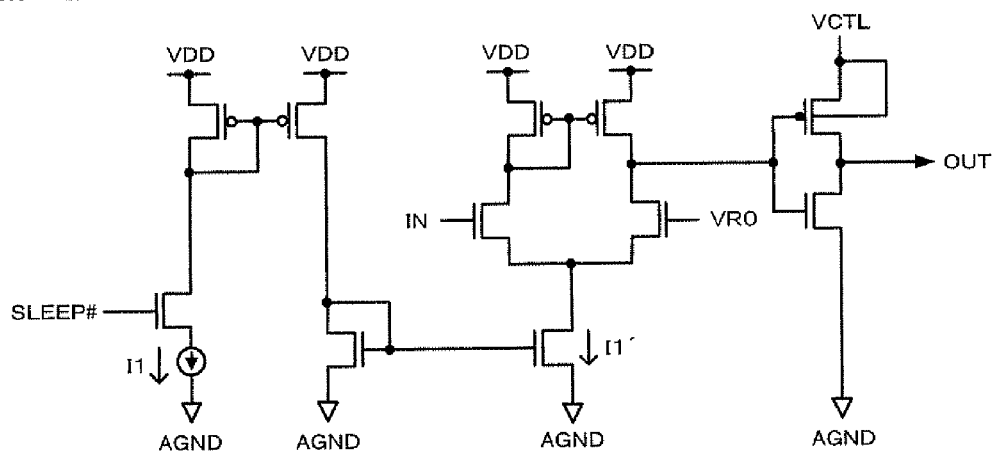

FIGS. 4A and 4B are circuit diagrams showing a configuration example of the GCA 20.

FIG. 4A shows a configuration example when forming the GCA 20 using a P-type differential amplifier, and FIG. 4B shows a configuration example when forming the GCA 20 using an N-type differential amplifier. In FIGS. 4A and 4B, the sleep control signal SLEEP # is an inversion signal of the sleep control signal SLEEP.

In FIG. 4A, a current I0 generated by a current source is supplied as an operating current I0' of the P-type differential amplifier through two current-mirror circuits. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied to an output buffer. The output signal from the output buffer is supplied to one end of the first switching element SW1.

The high-potential-side power supply voltage and the low-potential-side power supply voltage of the two current-mirror circuits and the P-type differential amplifier are respectively the voltage VDD and the voltage AGND. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

In FIG. 4B, a current I1 generated by a current source is supplied as an operating current I1' of the N-type differential amplifier through two current-mirror circuits. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied to an output buffer. The output signal from the output buffer is supplied to one end of the first switching element SW1.

The high-potential-side power supply voltage and the low-potential-side power supply voltage of the two current-mirror circuits and the N-type differential amplifier are respectively the voltage VDD and the voltage AGND. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor Therefore, the output voltage of the output buffer can be changed by changing the control signal VCTL.

In FIGS. 4A and 4B, a substrate bias effect can be prevented by applying the control signal VCTL as the substrate potential of the P-type output transistor of the output buffer.

In FIGS. 4A and 4B, a current control transistor is provided in series with the current source. In FIG. 4A, the current source transistor is formed of a P-type transistor, and the sleep control signal SLEEP is supplied to the gate of the transistor.

In FIG. 4B, the current source transistor is formed of an N-type transistor, and the sleep control signal SLEEP# is supplied to the gate of the transistor. According to the configurations shown in FIGS. 4A and 4B, the source and the drain of the current control transistor are electrically disconnected when the sleep control signal SLEEP is set at the H level, whereby the current generated by the current source is not supplied to the current-mirror circuit. Therefore, the operation of the GCA 20 can be disabled (stopped) based on the sleep control signal SLEEP.

The configuration of the oscillation driver circuit 10 is not limited to the configuration shown in FIGS. 4A and 4B.

For example, the operation of the AGC circuit 40 is stopped (disabled) in the sleep mode. In this case, the voltage of each node of the AGC circuit 40 is variable. In particular, when the potential of the control signal VCTL is variable, the output signal from the GCA 20 also becomes variable. Therefore, when the oscillation driver circuit 10 transitions from the sleep mode to the normal mode, the output signal from the GCA 20 becomes variable due to the control signal VCTL of which the level is variable.

As a result, the vibrator 12 is caused to produce driving vibrations using the variable output signal from the GCA 20. For example, when the vibrator 12 utilizes a piezoelectric effect, since the vibrator 12 operates in proportion to the charge supplied, the vibrator 12 may break due to an output signal which cannot be controlled. As a modification according to this embodiment, an output fixing transistor which fixes the output from the integrator 46 may be provided.

Figure 5:
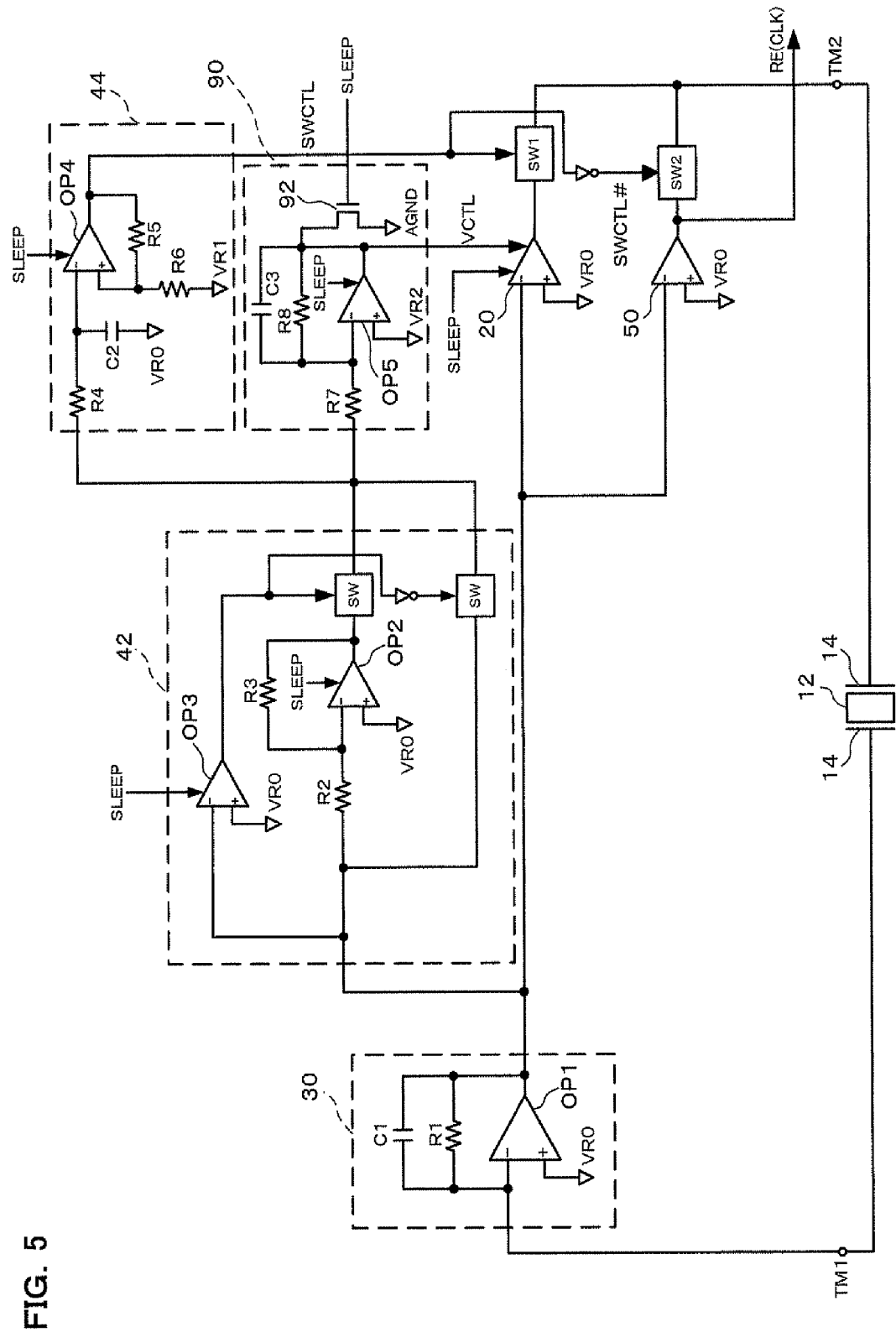
FIG. 5 is a circuit diagram showing another configuration example of the oscillation driver circuit shown in FIG. 1.

FIG. 5 is a circuit diagram showing another configuration example of the oscillation driver circuit 10 shown in FIG. 1.

In FIG. 5, the same sections as in FIG. 3 are indicated by the same symbols. Description of these sections is appropriately omitted. The oscillation driver circuit shown in FIG. 5 differs from the oscillation driver circuit 10 shown in FIG. 3 in that an integrator 90 is provided instead of the integrator 46 shown in FIG. 3.

The integrator 90 has a configuration in which an output fixing transistor 92 is added to the integrator 46 shown in FIG. 3.

The output fixing transistor 92 is formed of an N-type transistor The output node of the operational amplifier OP5 is connected with the drain of the output fixing transistor 92, and the voltage AGND is supplied to the source of the output fixing transistor 92. The sleep control signal SLEEP is supplied to the gate of the output fixing transistor 92.

According to this configuration, the output fixing transistor 92 is set in a conducting state when the sleep control signal SLEEP is set at the H level so that the output node of the integrator 90 is set at the same potential as the voltage AGND. This causes the potential of the control signal VCTL to be fixed so that the output signal from the GCA 20 does not become variable, even when the oscillation driver circuit 10 transitions from the sleep mode to the normal mode, whereby a situation in which the vibrator 12 breaks can be reliably prevented.

In FIG. 5, the output of the integrator is fixed by providing the output fixing transistor. Note that the invention is not limited to the configuration shown in FIG. 5.

Configuration and Operation of Vibrating Gyrosensor

Figure 6:
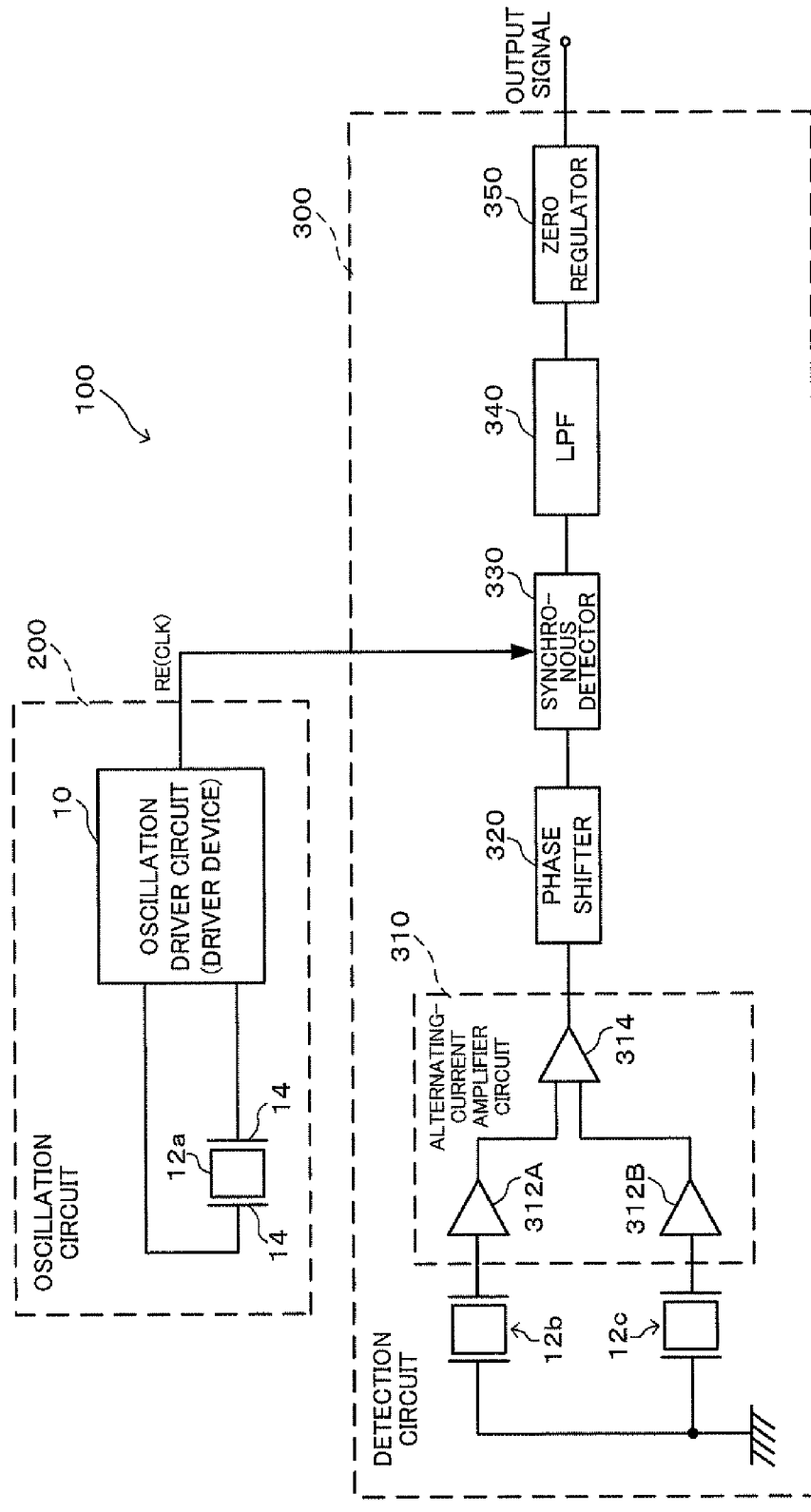
FIG. 6 is a block diagram showing a configuration example of a vibrating gyrosensor according to the second embodiment.

FIG. 6 is a block diagram showing a configuration example of a vibrating gyrosensor to which the oscillation driver circuit according to this embodiment (or its modification) is applied.

In FIG. 6, the sections as in FIG. 1 are indicated by the same symbols. Description of these sections is appropriately omitted.

A vibrating gyrosensor (physical quantity measuring device in a broad sense) 100 includes an oscillation circuit 200 and a detection circuit (detection device in a broad sense) 300. The oscillation circuit 200 includes the vibrator 12 and the oscillation driver circuit 10. The oscillation driver circuit 10 causes a driving vibration section 12*a* of the vibrator 12 to oscillate.

During oscillation startup in the normal mode, the output from the comparator 50 is input to the oscillation driver circuit 10 as noise. The noise is subjected to frequency selection while passing through the driving vibration section 12*a* of the vibrator 12. The signal which has passed through the driving vibration section 12*a* is partially removed, input to the full-wave rectifier 42, and converted into an amplitude. The signal with the amplitude is input to the oscillation detector 44 to generate the switch control signal SWCTL. Since the amplitude of the signal subjected to frequency selection while passing through the vibrator 12*a* is small during the oscillation startup, the oscillation detector 44 generates the switch control signal SWCTL set at the L level.

The amplitude of the signal subjected to frequency selection while passing through the vibrator 12*a* increases immediately after oscillation startup in the normal mode, whereby the oscillation detector 44 generates the switch control signal SWCTL set at the H level. This causes the oscillation loop to be switched so that the amplitude of the signal subjected to frequency selection while passing through the vibrator 12*a* is controlled by the GCA 20. When most of the noise is cut off by the driving vibration section 12*a* and the output from the full-wave rectifier 42 is relatively small, the gain of the GCA 20 is increased so that the loop gain of the oscillation loop becomes unity. Since the output from the full-wave rectifier 42 increases with the passage of time, the gain of the GCA 20 is reduced so that the loop gain becomes unity.

The vibrating gyrosensor is controlled in the sleep mode in the same manner as in the oscillation startup state in the normal mode.

When the oscillation state of the driving signal has been stabilized, signals from driving detection sections 12*b* and 12*c* of the vibrator 12 start to be detected. Specifically, the detection signals (alternating-current) from the driving detection sections 12*b* and 12*c* of the vibrator are amplified using alternating-current amplifiers 312A and 312B of an alternating-current amplifier circuit 310, and the outputs from the amplifiers 312A and 312B are summed up by an adder 314.

The output from the adder 314 is caused to pass through a phase shifter 320 to obtain a phase shift signal. The phase of the phase shift signal differs from the phase of the synchronous detection clock signal which is the output from the comparator 50 of the oscillation driver circuit 10 by a specific angle such as 90°. The phase shift signal and the synchronous detection clock signal from the oscillation driver circuit 10 are input to a synchronous detector 330 to detect the output signal from the vibrator 12. As a result, unnecessary leakage signals are removed from the detected output signal or at least reduced. Since the phase can be adjusted according to a change in phase during the weak signal detection process by adjusting the phases of the synchronous detection clock signal and the detection signal using the detection circuit 300, a highly accurate phase adjustment can be achieved while preventing an increase in circuit scale.

The detected output signal is input to a low-pass filter 340, smoothed, and input to a zero regulator 350. The output from the zero regulator 350 is removed as an output signal corresponding to the physical quantity (e.g. angular velocity) to be measured.

Figure 10:
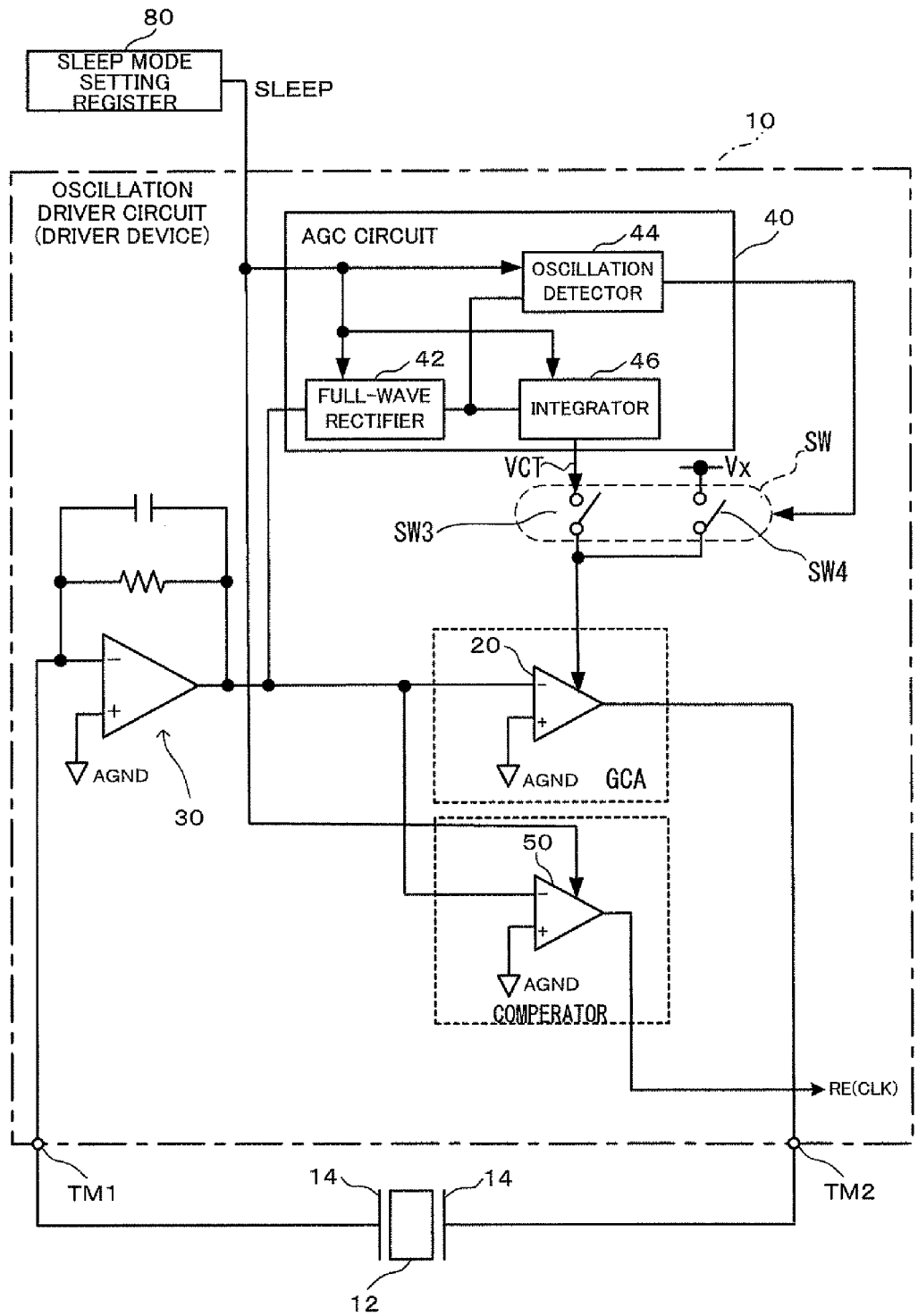
FIG. 10 is a block diagram showing a configuration example of an oscillation driver device according to a second embodiment.

The vibrating gyrosensor 100 shown in FIG. 10 is preferably provided in electronic instruments such as a video camera, a digital camera, a car navigation system, an aircraft, and a robot.

The invention is not limited to the vibrator 12 according to this embodiment. As examples of the material for the vibrator 12, constant modulus alloys such as elinvar and ferroelectric single crystals (piezoelectric single crystals) can be given. As examples of such single crystals, a crystal, lithium niobate, lithium tantalate, a lithium niobate-lithium tantalate solid solution, lithium borate, and langasite can be given. It is preferable that the vibrator 12 be hermetically sealed in a package. It is preferable that the package be filled with dry nitrogen or be under vacuum.

The physical quantity measured according to the invention is not limited to the angular velocity illustrated in this embodiment. The invention aims at a physical quantity which can be detected from a change in vibration state using a detection circuit when the vibrator is caused to produce driving vibrations and the vibration state of the vibrator has changed due to the effects of the physical quantity on the vibrator producing driving vibrations. As such a physical quantity, acceleration and angular acceleration are particularly preferred in addition to the angular velocity applied to the vibrator. As the detection device, an inertial sensor is preferred.

Rectangular wave drive, sine wave drive, and capacitive-coupling vibrator

The driver device according to this embodiment shown in FIG. 1 may employ rectangular wave drive and sine wave drive.

Figure 7A:
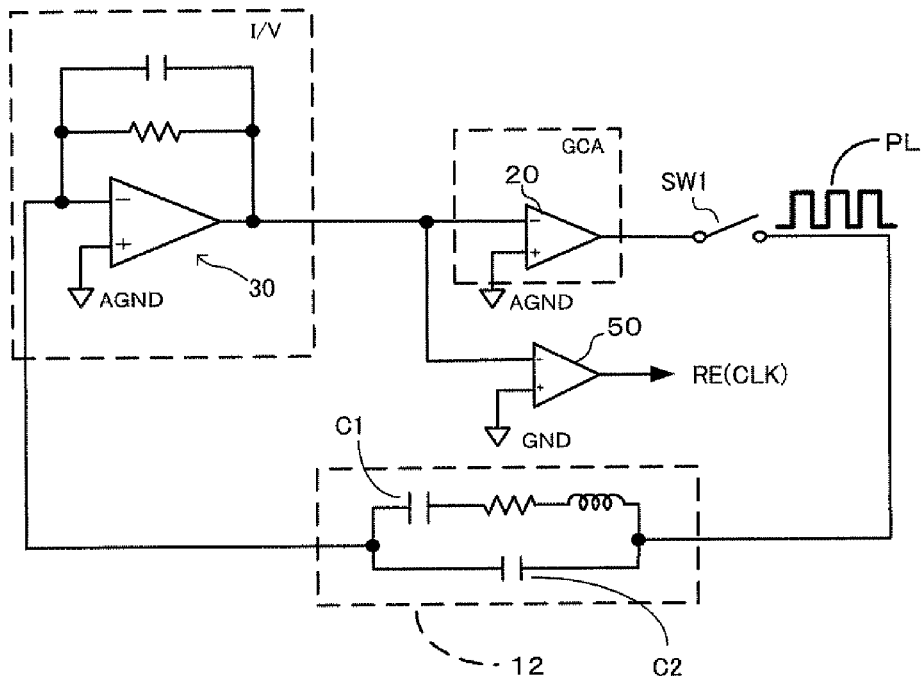
FIGS. 7A and 7B are circuit diagrams illustrative of rectangular wave drive, sine wave drive, and a capacitive-coupling vibrator.

FIG. 7A shows the major portion of the driver device which performs rectangular wave drive. As shown in FIG. 11A, the vibrator 12 is driven by a rectangular-wave driving signal (PL). The gain of the oscillation loop can be easily controlled by adjusting the high-level voltage or the low-level voltage of the driving signal (PL).

The rectangular-wave drive method has an advantage in that the variation in the driving signal (PL) is small. Moreover, since the voltage amplitude of the driving signal is easily controlled, the circuit configuration can be simplified, whereby the circuit scale can be reduced.

Figure 7B:
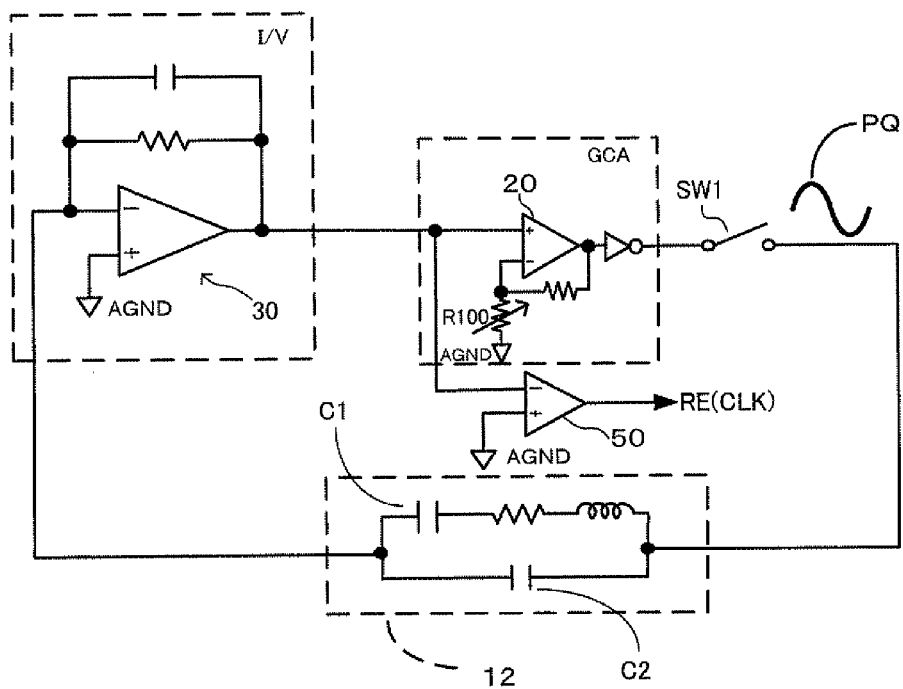

FIG. 7B shows the major portion of the driver device which performs sine wave drive. As shown in FIG. 7B, the vibrator 12 is driven by a sine-wave driving signal (PQ). The gain control amplifier (GCA) 20 controls the gain in the oscillation loop by variably controlling the resistance value of a variable resistor 100.

In FIGS. 7A and 7B, a capacitive-coupling vibrator is used as the vibrator 14. Note that the vibrator 14 is not limited thereto. Various vibrators such as a variable-resistance vibrator may also be used.

The capacitive-coupling vibrator (capacitive vibrator) is a vibrator in which a direct-current blocking capacitor (C1 and C2 in FIGS. 7A and 7B) lies in the signal path in the internal equivalent circuit. A piezoelectric element can be given as an example of the capacitive-coupling vibrator (capacitive vibrator).

When using the capacitive-coupling vibrator, an arbitrary potential may be used as the direct-current potential of the oscillation loop. Therefore, the degrees of freedom relating to the circuit configuration are increased.

Second Embodiment

Figure 11:
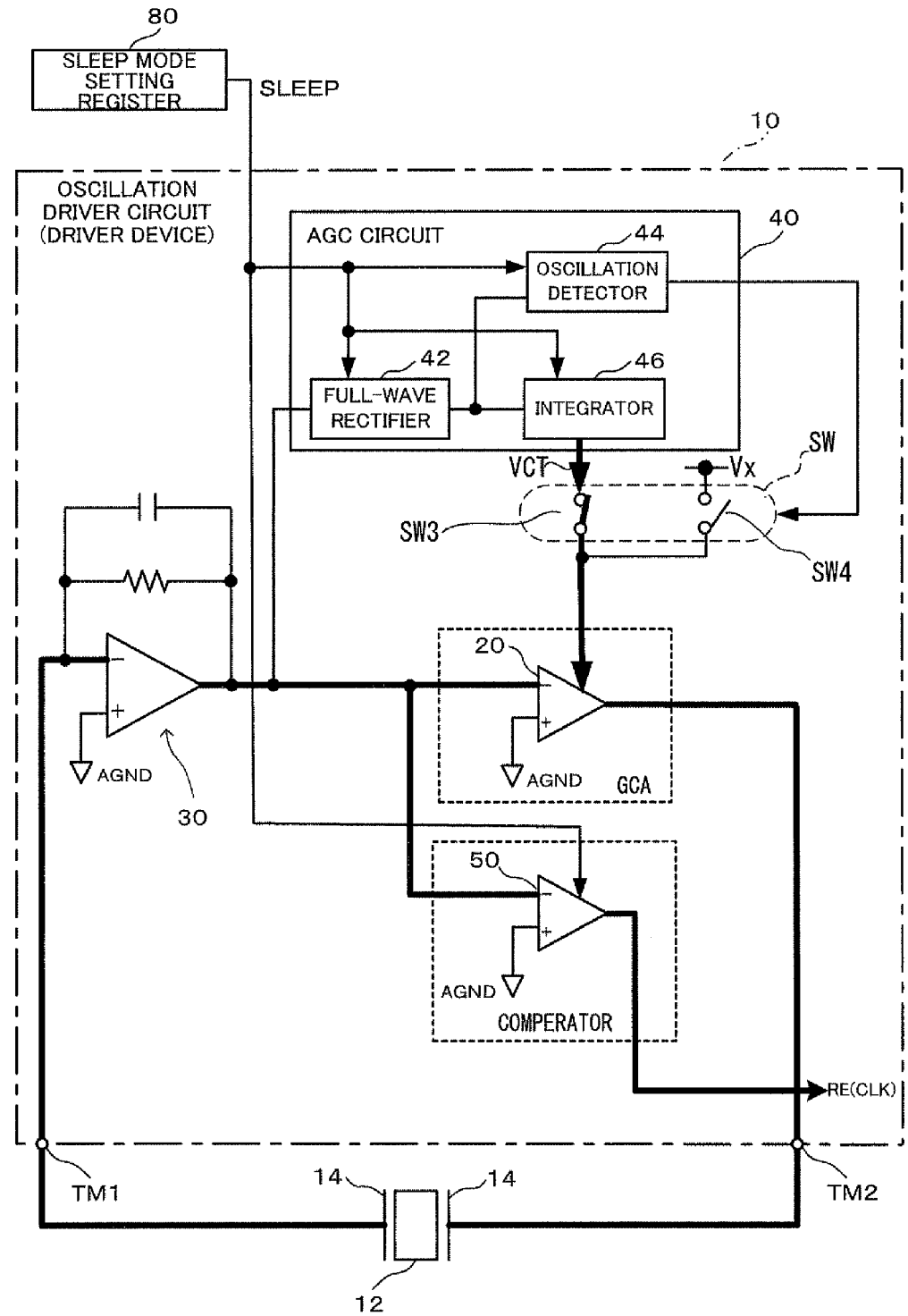
FIG. 11 is a view illustrative of the operation of the oscillation driver device shown in FIG. 10 in a normal operation mode.
Figure 12:
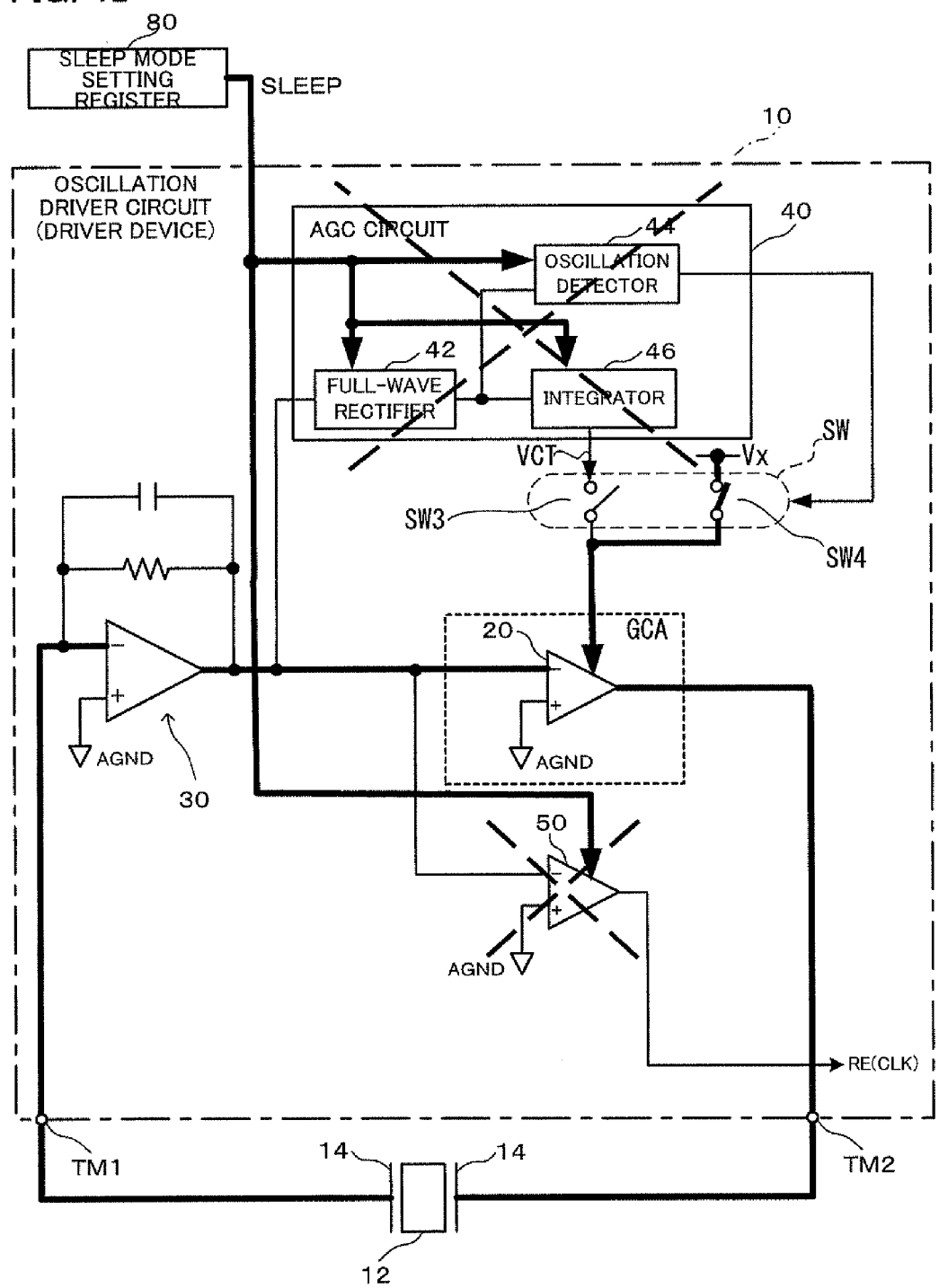
FIG. 12 is a view illustrative of the operation of the oscillation driver device shown in FIG. 10 in a low power consumption mode.

FIG. 10 is a circuit block diagram showing a configuration example of an oscillation driver circuit according to a second embodiment. FIG. 11 a view illustrative of the operation of the oscillation driver device shown in FIG. 10 in the normal operation mode. FIG. 12 a view illustrative of the operation of the oscillation driver device shown in FIG. 10 in the low power consumption mode.

The oscillation driver device according to this embodiment shown in FIG. 10 includes a first switch SW3 that is turned ON in the normal operation mode, is turned OFF in the low power consumption mode, and supplies a first gain control signal VCT output from the automatic gain control circuit to the gain control amplifier 20 when the first switch SW3 is turned ON, and a second switch SW4 that is turned OFF in the normal operation mode, is turned ON in the low power consumption mode, and supplies a second gain control signal Vx that causes the gain in the oscillation loop to be larger than unity to the gain control amplifier 20 when the second switch SW4 is turned ON.

The first switch SW3 and the second switch SW4 are ON/OFF-controlled based the output signal from the oscillation detector provided in the gain control circuit (AGC circuit) 40.

In this embodiment, only the oscillation loop including the gain control amplifier is used as the oscillation loop that drives the vibrator. On the other hand, the gain control signal (VCT or Vx) supplied to the gain control amplifier 20 is changed corresponding to the operation mode of the oscillation driver device.

In the normal operation mode, the first gain control signal output from the gain control circuit is supplied to the gain control amplifier through the first switch SW3, as shown in FIG. 11. In FIG. 11, the operation of the oscillation driver device 10 is indicated by a bold solid line.

In the normal operation mode, the voltage level of the output signal from the gain control amplifier 20 is adjusted based on the first gain control signal VCT so that the gain in the oscillation loop is always maintained to be unity.

In the low power consumption mode, the second gain control signal Vx is supplied to the gain control amplifier 20 through the second switch SW4, as shown in FIG. 12. In the low power consumption mode, the voltage level of the output signal from the gain control amplifier 20 exceeds the maximum amplitude in the normal operation mode based on the second gain control signal Vx so that the gain in the oscillation loop is maintained to be larger than unity.

Note that the gain in the oscillation loop may be maintained to be unity or a value close to unity. The expression "maintaining the gain in the oscillation loop to be larger than unity" includes maintaining the gain in the oscillation loop to be unity or a value close to unity.

The details are described below. In FIGS. 10 to 12, the first gain control signal VCT and the second gain control signal Vx are voltage signals. The voltage signal is supplied to the gain control amplifier 20 as the high-potential-side power supply voltage (VDD) of the gain control amplifier 20.

The first and second gain control signals (VCT and Vx) are supplied to the gain control amplifier 20 through the first and second switches (SW3 and SW4) as the high-potential-side power supply voltage (VDD) of the gain control amplifiers 20.

The output voltage level of the gain control amplifier 20 changes when the voltage level of the high-potential-side power supply voltage (VDD) has changed. For example, the high-potential-side power supply voltage (VDD) supplied to an output-stage circuit (configured using a CMOS inverter or the like: not shown) of the gain control amplifier 20 is changed so that the voltage amplitude of the output signal from the output-stage circuit (not shown) changes.

For example, the first gain control signal VCT from the automatic gain control circuit (AGC circuit) 40 is supplied to the gain control amplifier through the first switch SW3 as the high-potential-side power supply voltage (VDD). When the voltage level of the high-potential-side power supply voltage is set at VCT, the voltage level of the output signal from the gain control amplifier 20 swings between the voltage VCT and the voltage GND (reference potential), for example. The voltage level of the first gain control signal VCT is adjusted by controlling the automatic gain control circuit (AGC circuit) 40 so that the gain in the oscillation loop is always maintained to be unity (state shown in FIG. 11).

When the second gain control signal Vx is supplied to the gain control amplifier 20 through the second switch SW4 as the high-potential-side power supply voltage (VDD) in order to set the gain in the oscillation loop to be larger than unity, the voltage level of the high-potential-side power supply voltage is set at Vx (e.g., Vx>VCT). The voltage amplitude of the output signal from the gain control amplifier 20 swings between the voltage Vx and the voltage GND, for example.

When the relationship "maximum value of VCT≦Vx" is satisfied, the voltage amplitude of the output signal from the gain control amplifier 20 increases by supplying the voltage (second gain control signal) Vx. Specifically, since the voltage amplitude of the drive signal from the vibrator increases sufficiently, the gain in the oscillation loop becomes larger than unity.

The gain in the oscillation loop can be easily maintained to be larger than unity in the low power consumption mode using a simple method that changes the high-potential-side power supply voltage supplied to the gain control amplifier 20 by complementarily switching the first switch SW3 and the second switch SW4.

Therefore, when the oscillation driver device returns to the normal operation mode after the low power consumption mode has been canceled, the oscillation driver device can promptly transition to the steady oscillation state without oscillation startup.

For example, when the gyrosensor is used for camera image stabilization, the oscillation driver device is set in the low power consumption mode when a release switch is not pressed. The oscillation driver device promptly returns to the normal operation mode when the release switch has been pressed halfway. This makes it possible to promptly implement image stabilization during photographing.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention.

The voltage AGND (analog reference voltage: VDD/2, for example) may be used as the reference voltage of the oscillation driver device. The voltage GND (0V) may also be used as the reference voltage.

What is claimed is:

1. An oscillation driver device that is connected to a vibrator to form an oscillation loop and causes the vibrator to produce driving vibrations, the oscillation driver device comprising:

a gain control amplifier that causes the vibrator to produce the driving vibrations by controlling an oscillation amplitude in the oscillation loop;

an automatic gain control circuit that controls the gain of the gain control amplifier based on a signal obtained from the oscillation loop; and a mode setting circuit that switches a mode between a normal operation mode and a low power consumption mode, when the mode setting circuit has switched the mode from the normal operation mode to the low power consumption mode, the automatic gain control circuit being disabled, and a gain in the oscillation loop that drives the vibrator changing from a state in which the gain in the oscillation loop is controlled to be unity by the automatic gain control circuit to a state in which the gain in the oscillation loop is set to be larger than unity; and when the mode setting circuit has switched the mode from the low power consumption mode to the normal operation mode, the automatic gain control circuit resuming operation, and the gain in the oscillation loop changing from the state in which the gain in the oscillation loop is set to be larger than unity to the state in which the gain in the oscillation loop is controlled to be unity by the automatic gain control circuit.

2. The oscillation driver device as defined in claim 1, the oscillation driver including a comparator that generates a synchronous detection reference signal based on a signal obtained from the oscillation loop, the synchronous detection reference signal being used to synchronously detect a detection signal obtained from the vibrator, the oscillation loop that drives the vibrator including a first oscillation loop that includes the vibrator and the gain control amplifier and a second oscillation loop that includes the vibrator and the comparator;

the gain in the second oscillation loop being larger than unity;

when the mode setting circuit has switched the mode from the normal operation mode to the low power consumption mode, the automatic gain control circuit being disabled, and the oscillation loop that drives the vibrator being switched from the first oscillation loop that includes the vibrator and the gain control amplifier to the second oscillation loop that includes the vibrator and the comparator; and when the mode setting circuit has switched the mode from the low power consumption mode to the normal operation mode, the automatic gain control circuit resuming operation, and the oscillation loop that drives the vibrator being switched from the second oscillation loop that includes the vibrator and the comparator to the first oscillation loop that includes the vibrator and the gain control amplifier.

3. The oscillation driver device as defined in claim 1, the oscillation driver device including:

a first switch that is turned ON in the normal operation mode and is turned OFF in the low power consumption mode, the first switch supplying a first gain control signal output from the automatic gain control circuit to the gain control amplifier when the first switch is turned ON; and a second switch that is turned OFF in the normal operation mode and is turned ON in the low power consumption mode, the second switch supplying a second gain control signal that causes the gain in the oscillation loop to be larger than unity to the gain control amplifier when the first switch is turned ON.

4. The oscillation driver device as defined in claim 3,
the first gain control signal and the second gain control signal being voltage signals, the voltage signals being supplied to the gain control amplifier as a high-potential-side power supply voltage of the gain control amplifier.

5. The oscillation driver device as defined in claim 1,
the vibrator being a capacitive-coupling vibrator; and
the gain control amplifier causing the vibrator to produce the driving vibrations by applying a rectangular-wave driving signal to the vibrator.

6. A physical quantity measuring device that measures a physical quantity corresponding to a detection signal output from a vibrator based on driving vibrations produced by the vibrator and the physical quantity to be measured, the physical quantity measuring device comprising:

the vibrator;

the oscillation driver device as defined in claim 1 that causes the vibrator to produce the driving vibrations; and a detection device that detects an output signal corresponding to the physical quantity based on the detection signal, the detection device including a synchronous detector that synchronously detects the detection signal based on the output from the comparator.

7. An electronic instrument comprising the physical quantity measuring device as defined in claim 6.

* * * * *